US008036283B2

(12) United States Patent
Irisawa et al.

(10) Patent No.: US 8,036,283 B2
(45) Date of Patent: Oct. 11, 2011

(54) DATA/STROBE ENCODING SCHEME CIRCUIT AND DATA/STROBE ENCODING METHOD

(75) Inventors: Hideki Irisawa, Tokyo (JP); Hiroki Hihara, Tokyo (JP); Shuichi Moriyama, Tokyo (JP)

(73) Assignees: NEC Soft, Ltd., Tokyo (JP); NEC TOSHIBA Space Systems, Ltd., Tokyo (JP)

( * ) Notice: Subject to any disclaimer, the term of this patent is extended or adjusted under 35 U.S.C. 154(b) by 1080 days.

(21) Appl. No.: 11/696,012

(22) Filed: Apr. 3, 2007

(65) Prior Publication Data

US 2007/0258292 A1 Nov. 8, 2007

(30) Foreign Application Priority Data

Apr. 3, 2006 (JP) .................................. 2006-102400
Apr. 26, 2006 (JP) .................................. 2006-122238

(51) Int. Cl.
*H04B 3/00* (2006.01)

(52) U.S. Cl. ........................................................ 375/257

(58) Field of Classification Search .................. 375/257, 375/295, 316, 259
See application file for complete search history.

(56) References Cited

U.S. PATENT DOCUMENTS

| 4,990,907 | A |  | 2/1991 | Jikihara et al. |  |
|---|---|---|---|---|---|
| 2002/0180719 | A1 | * | 12/2002 | Nagai et al. | 345/206 |
| 2004/0012435 | A1 | * | 1/2004 | Meguro | 327/408 |
| 2006/0055427 | A1 | * | 3/2006 | Tang et al. | 326/98 |

FOREIGN PATENT DOCUMENTS

WO   WO 2005/020081 A2   3/2005

OTHER PUBLICATIONS

"SpaceWire—Links, nodes, routers and networks" Internet Citation: ECSS-E-50-12A, [Online] Jan. 24, 2003, XP007902495 Noordwijk, The Netherlands Retrieved from the Internet: URL:http://spacewire.esa.int/content/Standard/ECSS-E50-12A.php>.
Parkes S M: "SpaceWire: A satellite on-board data-handling network" Aircraft Engineering, Bunhill Publications Ltd. London, GB, vol. 73, No. 4, 2001, pp. 374-379, XP002315626.
Chau S N et al: "A design-diversity based fault-tolerant COTS avionics bus network" Dependable Computing, 2001. Proceedings. 2001 Pacific Rim International Symposium on Seoul, South Korea Dec. 17-19, 2001, Los Alamitos, CA, USA, IEEE Comput. Soc, US, Dec. 17, 2001,pp. 35-42, XP010585359.

* cited by examiner

*Primary Examiner* — Kevin M Burd
(74) *Attorney, Agent, or Firm* — Sughrue Mion, PLLC

(57) ABSTRACT

In a data/strobe encoding scheme circuit in which data and a strobe signal are transmitted through different lines, changes respectively in the data and the strobe signal are employed as clock signals for a latching operation, and the data is transmitted to a succeeding-stage circuit operating on a second clock signal. The circuit latches predetermined data by an FF circuit and passes a data pair including a signal indicating that the data has been latched and held therein as well as the latched data to the succeeding-stage circuit, activates, if assertion of a signal indicating reception of the data is received from the succeeding-stage circuit, again the FF circuit which has latched the data and has entered a stop state, and receives new data. There is provided a data/strobe encoding scheme circuit and a data/strobe encoding method, it is possible to implement a data/strobe encoding scheme circuit and a data/strobe encoding method capable of realizing a low-cost data/strobe encoding scheme which is independent of LSI device characteristics and which can be easily designed.

9 Claims, 4 Drawing Sheets

DATA/STROBE ENCODING SCHEME CIRCUIT AND DATA/STROBE ENCODING METHOD

BACKGROUND OF THE INVENTION

1. Field of the Invention

The present invention relates to a data/strobe encoding scheme circuit and a data/strobe encoding method.

2. Description of the Related Art

According to the transmission method of the interface standard "SpaceWire", serial data (Data) and strobe signals (Strobe) employed, for example, in IEEE1394 are transmitted through mutually different lines. When the data changes, a strobe signal is kept unchanged in an encoding scheme called "Data/Strobe (D/S) encoding (DS-Link encoding)". According to the conventional art, in a receiver circuit of the D/S encoding scheme, to carry out an operation in which a command received by the receiver is latched and is then passed to a circuit in a succeeding stage, it is required to decode the command including the last bit thereof, and latch or hold the decoded result by a flip-flop (FF) circuit.

However, it is required that if the strobe does not change, a change in the data is used as a clock signal, which is created through an exclusive OR (XOR) operation between the data and the strobe, and then the data value after the change is held by a flip-flop circuit. In the operation, the setup time for the data is substantially equal to the delay time corresponding to the XOR operation. Additionally, it is necessary to decode a command using a plurality of successive bits to deliver the decoded result to a succeeding-stage circuit. For the last bit data of the command, it is not guaranteed that the subsequent clock signal (a change in the data or the strobe) appears after the latching operation. Therefore, it is required to simultaneously obtain the decoded value when the last data bit of the command is latched in the flip-flop circuit. If the operation is conducted without any countermeasures, there occurs a problem that the setup time is insufficient for the input data and the data is not correctly decoded.

To remove the problem in the conventional art, there have been taken countermeasures to provide the setup time for data. Specifically, in the processing of the receiver circuit using the D/S encoding, i.e., D/S link encoding to latch and to pass the command to the succeeding-stage circuit, to conduct a command decoding operation including the last bit of the data bit string, a delay control circuit including an analog circuit adopting a delay element is adopted for the clock signal created through the XOR operation between the data and the strobe, to thereby provide the setup time for data.

However, to implement Large Scale Integration (LSI) of the circuit system in this configuration, since the delay depends on the device characteristic of the LSI circuit, it is required to design a new delay circuit for each device characteristic. Or, it is necessary to replace the circuit section to create the clock signal through the XOR operation between the data and the strobe by an LSI circuit dedicated to control the delay time, to resultantly create a clock signal to which the delay is added.

Therefore, the conventional art is attended with a problem in which the designing job of the delay circuit for each LSI circuit and the use of the dedicated LSI elongate the designing period of time and increase the production cost.

SUMMARY OF THE INVENTION

It is therefore an objective of the present invention, which has been devised to remove the problem, to provide a data/strobe encoding scheme circuit and a data/strobe encoding method capable of implementing a low-cost D/S encoding (D/S link) scheme which is independent of the LSI device characteristic and which can be easily designed.

There is provided a data/strobe encoding scheme circuit in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage. The data/strobe encoding scheme circuit latches predetermined data by a flip-flop circuit and passes a data pair including a signal indicating that the data has been latched and held therein as well as the data latched as above to the succeeding-stage circuit, and activates, if assertion of a signal indicating reception of the data is received from the succeeding-stage circuit, again the flip-flop circuit which has latched the data and has entered a stop state, and receives new data.

There is also provided a data/strobe encoding scheme circuit in which data and a strobe signal are transmitted through mutually different lines, a change in the data and a change in the strobe signal are employed as clock signals for a latching operation, and the data is transmitted to a circuit operating on a second clock signal in a succeeding stage. The data/strobe encoding scheme circuit includes a clock generator circuit for generating and outputting a clock signal according to predetermined data and a predetermined strobe signal and changing the clock signal when the data or the strobe signal varies, a clock enable generator circuit for generating and outputting an enable signal to enable latching of the data, a flip-flop enable flag generator circuit for creating and outputting, synchronized with the clock enable generator circuit, if the clock signal produced from the clock generator circuit is changed, a flip-flop enable flag indicating a flip-flop circuit having latched data to be received; a data latch flip-flop array including a plurality of flip-flop circuits for latching the data by a flip-flop circuit selected by an enable signal produced from the clock enable generator circuit and producing the data as flip-flop output data, a meta-stable countermeasure circuit for flip-flop data enable flag for taking meta-stable countermeasures for the flip-flop data enable flag produced from the flip-flop enable flag generator circuit, a command decoder circuit for receiving the flip-flop output data produced from the data latch flip-flop array and the flip-flop data enable flag processed through meta-stable countermeasures by the meta-stable countermeasure circuit for flip-flop data enable flag, and a meta-stable countermeasure circuit for flip-flop data acknowledge signal for taking meta-stable countermeasures for the flip-flop data acknowledge signal produced from the command decoder circuit. The command decoder circuit refers to the flip-flop data enable flag and latches, for bits thus asserted, the flip-flop output data received from the data latch flip-flop array, according to the clock signal of the succeeding-stage circuit, and asserts, each time data is received from the flip-flop circuit, the flip-flop data acknowledge signal for the flip-flop enable flag generator circuit. The flip-flop enable flag generator circuit receives the flip-flop data acknowledge signal which is produced from the command decoder circuit and for which the meta-stable countermeasure circuit for flip-flop data acknowledge signal has taken meta-stable countermeasures and then sends to the clock enable generator circuit an empty flip-flop indication signal indicating a flip-flop circuit not having held unread data. The clock enable generator circuit receives the empty flip-flop indication signal from the flip-flop enable flag generator circuit, sequentially generates enable signals, and sets the flip-flop circuit of the data latch flip-flop array in a state not receiving new data, again to an input enable state.

The command decoder circuit may decode a command using data including a plurality of bits received from the data latch flip-flop array when an amount of data bits of the data reaches a value to conduct a command decoding operation, determine command data for the succeeding-stage circuit, assert a command enable signal, and stop assertion of the command enable signal if assertion of a command acknowledge signal is received from the succeeding-stage circuit.

Each of the meta-stable countermeasure circuit for flip-flop data enable flag and the meta-stable countermeasure circuit for flip-flop data acknowledge signal may include flip-flop circuits in stages the number of which corresponds to an operation frequency or the like.

The number of flip-flop circuits of the data latch flip-flop array may be determined by an operation frequency of a clock signal produced from the clock generator circuit and an operation frequency of a clock signal for an operation frequency of a clock signal.

There is also provided a data/strobe encoding scheme circuit in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage. When a state of a state machine controlling data transfer of data in the succeeding-stage circuit is changed from a state to an error reset state which is a state indicating an initial state and a reset state, a pseudo clock signal is fed to a preceding-stage circuit in a preceding stage to thereby passing final result of a decoding operation to the succeeding-stage circuit.

There is also provided a data/strobe encoding scheme circuit in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage. The data/strobe encoding scheme circuit includes a clock generator circuit for generating and outputting a clock signal according to predetermined data and a predetermined strobe signal and changing the clock signal when the data or the strobe signal varies, a clock enable generator circuit for generating and outputting an enable signal to enable latching of the data, a data latch flip-flop array including a plurality of flip-flop circuits for latching the data including a plurality of successive bits constituting a command, by a flip-flop circuit selected by an enable signal produced from the clock enable generator circuit and producing the data as flip-flop output data; a command decoder circuit for receiving the flip-flop output data produced from the data latch flip-flop array, a meta-stable countermeasure circuit for flip-flop data command enable signal for taking meta-stable countermeasures for a command enable signal produced from the command decoder circuit, a meta-stable countermeasure circuit for flip-flop data acknowledge signal for taking meta-stable countermeasures for a flip-flop data acknowledge signal produced from the succeeding-stage circuit, and a clock generator circuit for monitoring a status signal which is asserted if a state of a state machine controlling data transfer of data in the succeeding-stage circuit is an error reset state which is a state indicating an initial state and an error reset state, generating one pulse if the status signal is changed to an asserted state, and conducting an eXclusive OR (XOR) operation between the pulse and the strobe signal to thereby create a pseudo clock signal. The command decoder circuit receives the flip-flop output data produced from the data latch flip-flop array, counts the bits of the data including a plurality of bits according to the clock signal produced from the clock generator circuit, and decodes a command for the flip-flop output data when an amount of bits of the data reaches a value to conduct a decoding operation. The command decoder circuit latches, if the command is other than a last command as a result of the decoding operation, a decoded result of the decoding operation according to a subsequent clock signal, determines command data for the succeeding-stage circuit, and asserts the command enable signal for which the meta-stable countermeasure circuit for flip-flop data command enable signal has taken meta-stable countermeasures. The command decoder circuit receives a command acknowledge signal which is produced from the succeeding-stage circuit and for which the meta-stable countermeasure circuit for flip-flop data acknowledge signal has taken meta-stable countermeasures, stops assertion of the command enable signal, and decodes again a command using the flip-flop output data. The command decoder circuit monitors by the clock generator circuit, if the command is the last command as a result of the decoding operation, the status signal which is asserted if the state of a state machine controlling data transfer of data in the succeeding-stage circuit is an error reset state which is a state indicating an initial state and an error reset state, assumes that a link has been disconnected, if the status signal is changed to an asserted state, generates one pulse, and conducts an XOR operation between the pulse and the strobe signal to thereby create a pseudo clock signal. The command decoder circuit latches, according to the pseudo clock signal, the last command thus decoded, determines command data for the succeeding-stage circuit, and asserts the command enable signal for which the meta-stable countermeasure circuit for flip-flop data command enable signal has taken meta-stable countermeasures. The command decoder circuit receives the command acknowledge signal which is produced from the succeeding-stage circuit and for which the meta-stable countermeasure circuit for flip-flop data acknowledge signal has taken meta-stable countermeasures, stops assertion of the command enable signal, and waits for an input of a subsequent command.

Each of the meta-stable countermeasure circuit for flip-flop data command enable signal and the meta-stable countermeasure circuit for flip-flop data acknowledge signal may include flip-flop circuits in stages the number of which corresponds to an operation frequency or the like.

There is also provided a data/strobe encoding method in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage. The data/strobe encoding method includes the steps of latching predetermined data by a flip-flop circuit and passing a data pair including a signal indicating that the data has been latched and held therein as well as the data latched as above to the succeeding-stage circuit, and receiving assertion of a signal indicating reception of the data from the succeeding-stage circuit, activating again the flip-flop circuit which has latched the data and has entered a stop state, and thereby receiving new data.

There is also provided a data/strobe encoding method in which data and a strobe signal are transmitted through mutually different lines, a change in the data and a change in the strobe signal are employed as clock signals for a latching operation, and the data is transmitted to a circuit operating on a second clock signal in a succeeding stage. The data/strobe encoding method includes a clock generating step of generating and outputting a clock signal according to predetermined data and a predetermined strobe signal and changing the clock signal when the data or the strobe signal varies, a clock enable generating step of generating and outputting an enable signal to enable latching of the data, a flip-flop enable flag generating step of creating and outputting, synchronized with the clock enable generator circuit, if the clock signal produced from the clock generator circuit is changed, a flip-flop enable flag indicating a flip-flop circuit having latched data to be received; a flip-flop data output step of latching the data by a flip-flop circuit selected by an enable signal produced from the clock enable generating step, a meta-stable countermeasure step for flip-flop data enable flag of taking meta-stable countermeasures for the flip-flop data enable flag produced from the flip-flop enable flag generating step, a flip-flop output data latching step of referring to the flip-flop data enable flag for which the meta-stable countermeasure step for flip-flop data enable flag has taken meta-stable countermeasures and latching, for bits thus asserted, the flip-flop output data outputted from the flip-flop data output step, according to the clock signal of the succeeding-stage circuit; a flip-flop data acknowledge signal output step of outputting a flip-flop data acknowledge signal each time data is received from each flip-flop circuit, a meta-stable countermeasure step for flip-flop data acknowledge signal of taking meta-stable countermeasures for the flip-flop data acknowledge signal produced from the flip-flop data acknowledge signal output step, an empty flip-flop indication output step of receiving the flip-flop data acknowledge signal for which the meta-stable countermeasure step for flip-flop data acknowledge signal has taken meta-stable countermeasures and then producing an empty flip-flop indication signal indicating a flip-flop circuit not having held unread data, and a data input enable step of receiving the empty flip-flop indication signal from the empty flip-flop indication output step and setting the flip-flop circuit in a state not receiving new data, again to an input enable state.

The data/strobe encoding method may further include a command enable signal asserting step of decoding a command using data including a plurality of bits received in the flip-flop data output step when an amount of data bits of the data reaches a value to conduct a command decoding operation, determining command data for the succeeding-stage circuit, and asserting a command enable signal; and a command enable signal assertion stop step of stopping assertion of the command enable signal if assertion of a command acknowledge signal is received from the succeeding-stage circuit.

There is also provided a data/strobe encoding method in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage. When a state of a state machine controlling data transfer of data in the succeeding-stage circuit is changed from a state to an error reset state which is a state indicating an initial state and a reset state, a pseudo clock signal is fed to a preceding-stage circuit in a preceding stage to thereby passing final result of a decoding operation to the succeeding-stage circuit.

There is also provided a data/strobe encoding method in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage. The data/strobe encoding method includes a clock generating step of generating and outputting a clock signal according to predetermined data and a predetermined strobe signal and changing the clock signal when the data or the strobe signal varies, a clock enable generating step of generating and outputting an enable signal to enable latching of the data, a flip-flop data output step of latching the data including a plurality of successive bits constituting a command, by a flip-flop circuit selected by an enable signal produced in the clock enable generating step and producing the data as flip-flop output data; a command decoding step of receiving the flip-flop output data produced in the data latch flip-flop output step, counting the bits of the data including a plurality of bits according to the clock signal produced in the clock generating step, and decoding a command for the flip-flop output data when an amount of bits of the data reaches a value to conduct a decoding operation; a step of latching, if the command is other than a last command as a result of the decoding operation, a decoded result of the decoding operation according to a subsequent clock signal, determining command data for the succeeding-stage circuit, asserting the command enable signal for which a meta-stable countermeasure circuit for flip-flop data command enable signal has taken meta-stable countermeasures; a step of receiving a command acknowledge signal which is produced from the succeeding-stage circuit and for which a meta-stable countermeasure circuit for flip-flop data acknowledge signal has taken meta-stable countermeasures, stopping assertion of the command enable signal, and decoding again a command using the flip-flop output data; a step of monitoring, if the command is the last command as a result of the decoding operation, a status signal which is asserted if a state of a state machine controlling data transfer of data in the succeeding-stage circuit is an error reset state which is a state indicating an initial state and an error reset state, assuming that a link has been disconnected, if the status signal is changed to an asserted state, generating one pulse, and conducting an XOR operation between the pulse and the strobe signal to thereby create a pseudo clock signal; a step of latching, according to the pseudo clock signal, the last command thus decoded, determining command data for the succeeding-stage circuit, and asserting the command enable signal for which the meta-stable countermeasure circuit for flip-flop data command enable signal has taken meta-stable countermeasures; and a step of receiving the command acknowledge signal which is produced from the succeeding-stage circuit and for which the meta-stable countermeasure circuit for flip-flop data acknowledge signal has taken meta-stable countermeasures, stopping assertion of the command enable signal, and waiting for an input of a subsequent command.

In accordance with the present invention, there can be implemented a low-cost, easily designable data/strobe encoding scheme circuit that is independent of LSI device characteristics.

BRIEF DESCRIPTION OF THE DRAWINGS

The objectives and features of the present invention will become more apparent from the consideration of the following detailed description taken in conjunction with the accompanying drawings in which.

DESCRIPTION OF THE EMBODIMENTS

Referring next to the accompanying drawings, description will be given in detail of embodiments.

According to aspects of the present invention, it is possible to remove the problem of the conventional art in which to achieve the D/S encoding scheme or the DS-link scheme, there are required the new designing job for the delay circuit adapted to device characteristics of LSI circuits and the arrangement of dedicated LSI circuits to adjust the delay and hence the designing period of time and the cost are increased. That is, the problem can be solved by only a logical designing job without requiring the designing of a dedicated analog circuit in consideration of the delay. There can be hence implemented a low-cost, easily designable D/S encoding or DS-link scheme receiver circuit that is independent of LSI device characteristics.

First Embodiment

First, description will be given of an outline of the first embodiment.

Data of one bit is latched by a flip-flop circuit. The latched data and a signal indicating that the data has been latched are combined with each other into a pair to be delivered to the succeeding-stage circuit operating on a second clock signal. Thereafter, an assertion signal indicating reception of the signal is received from the succeeding-stage circuit, and then the flip-flop circuit having held the data and having entered a halt state is again activated to thereby obtain new data. The succeeding-stage circuit decodes the command.

Next, referring to FIG. 1, description will be given of structure of the first embodiment.

Figure 1:
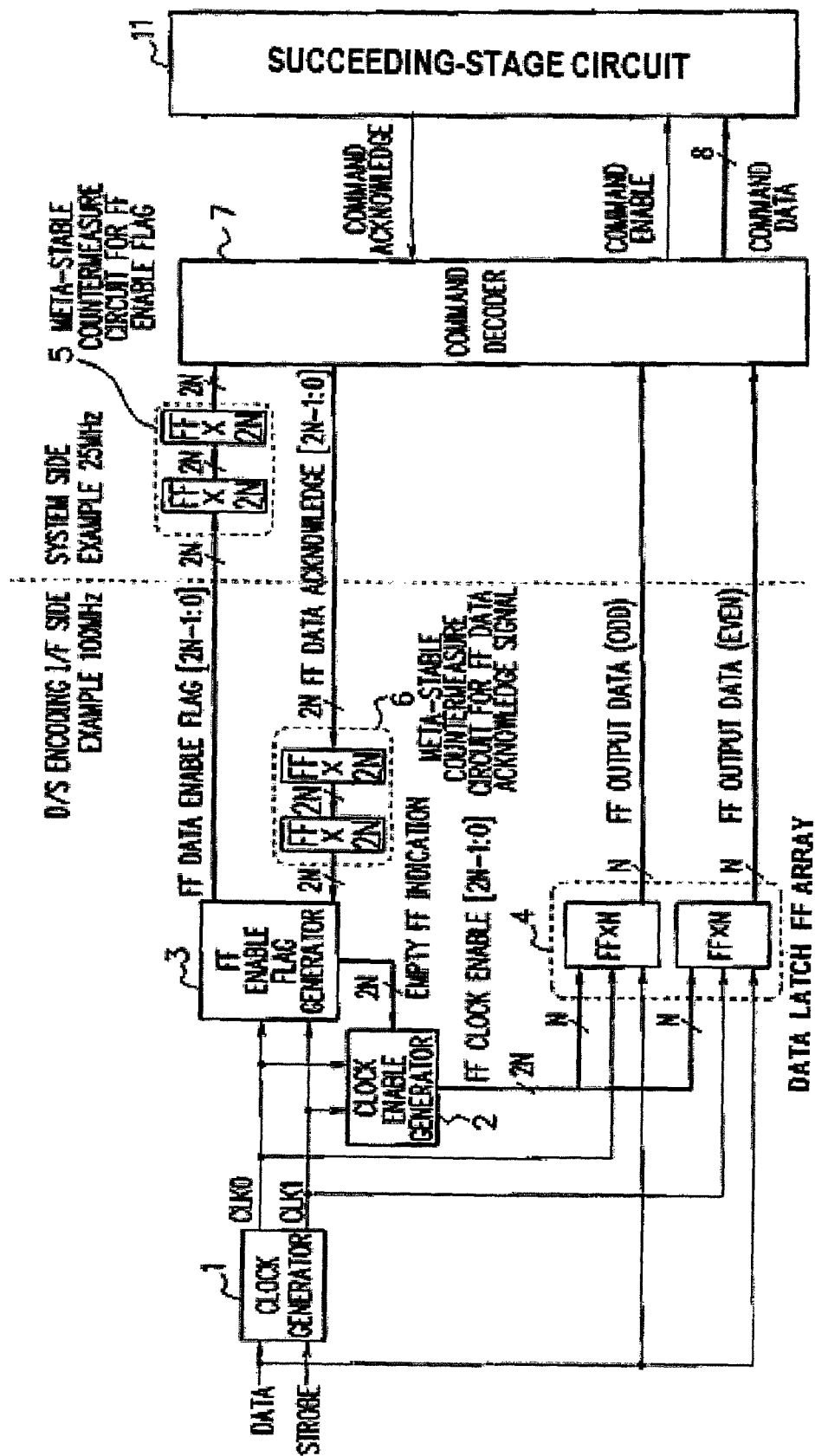
FIG. 1 is a schematic block diagram showing an overall configuration of a first embodiment.

The embodiment of FIG. 1 includes a clock generator 1, a clock enable generator 2, a flip-flop enable flag generator 3, a data latch flip-flop array 4, a meta-stable countermeasure circuit for flip-flop data enable flag 5, a meta-stable countermeasure circuit for flip-flop data acknowledge signal 6, and a command decoder 7.

In the configuration of FIG. 1, the generator 1, the generator 2, the generator 3, the array 4, and the circuit 6 operate according to a clock signal created using the data and the strobe. In the first embodiment, these circuits are collectively called "D/S encoding InterFace (I/F) side".

In FIG. 1, the circuit 5 and the decoder 7 operate using a clock signal for the succeeding-stage circuit 11. In the embodiment, these circuits are collectively called "system side".

The generator 1 is a circuit to generate a clock signal for the D/S encoding (DS-link) scheme in which serial data and a strobe signal are transmitted via mutually different lines. When the data or the strobe signal changes, the generator 1 changes its clock signal (CLK0, CLK1). The signal CLK0 is a reverse signal of the signal CLK1.

The clock enable generator 2 asserts, for one of the flip-flop (FF) circuits of the array 4, an enable signal, i.e., a flip-flip clock enable signal to enable latching of one-bit data. The flip-flop circuit to be enabled is determined on the basis of a signal (an empty FF indication signal) indicating a flip-flop not holding unread data from the generator 3. In this fashion, the generator 2 sequentially produces enable signals.

The generator 3 creates a signal (an empty FF indication signal) indicating a flip-flop circuit not holding unread data (the command decoder has received data) and passes the signal to the generator 2. When the signal CLK0 or CLK1 from the generator 1 changes, the generator 3 operates synchronized with the generator 2 to assert for the decoder 7 a signal (an FF data enable flag) indicating a flip-flop circuit in which data to be received is held.

The array 4 latches one-bit data in a flip-flop circuit selected by the enable signal (flip-flop enable signal) produced from the generator 2.

The circuit 5 is disposed, since the "FF data enable flag" is asynchronously transferred between the generator 3 and the decoder 7, to suppress influence at occurrence of a meta-stable state. The circuit 5 includes flip-flop circuits, generally formed in a two-stage cascade configuration. The number of stages may be varied according to, for example, the operation frequency.

The circuit 6 is disposed, since the "FF data acknowledge signal" is asynchronously transferred between the decoder 7 and the generator 3, to suppress influence at occurrence of a meta-stable state. The circuit 6 includes flip-flop circuits to be generally formed in a two-stage cascade configuration. The number of stages may be changed depending on associated factors such as the operation frequency.

The decoder 7 decodes a command using data including a plurality of bits received from the array 4, determines "command data" for the succeeding-stage circuit 11, and then asserts a command enable signal. When an assertion signal for a command acknowledge signal is received from the succeeding-stage circuit 11, the decoder 7 stops the assertion of the command enable signal.

Figure 2:
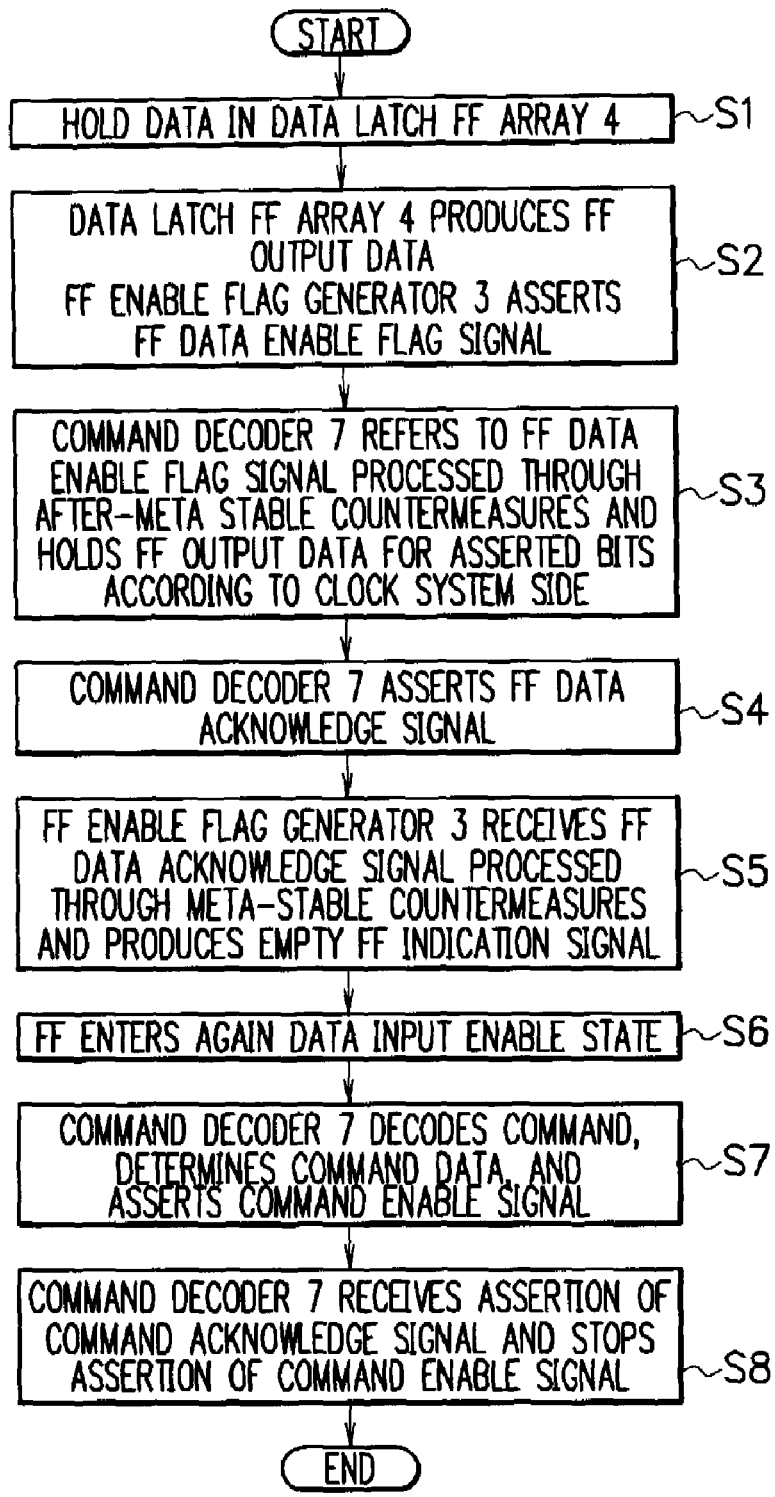
FIG. 2 is a flowchart showing operation of the first embodiment.

Referring now to FIGS. 1 and 2, description will be given of operation of the first embodiment.

The array 4 holds one-bit data (step S1) to produce the data as an FF output data signal. The generator 3 asserts, for the decoder 7, an FF data enable flag signal indicating that data to be paired with the FF output data signal has been held in a flip-flop circuit thereof, for example, the data bit rate is 100 megabits per second (Mbps; step S2). The assertion signal is a level output, and the flip-flop circuit does not receive new data during the assertion. New data is latched by a second flip-flop circuit not having held data.

The decoder 7 operates using another clock signal at, for example, 25 megahertz (MHz). The decoder 7 refers to the FF data enable flag signal that is produced from the generator 3 and for which the meta-stable countermeasures are taken by the circuit 5. For the bits asserted, the decoder 7 latches the FF output data signal from the array 4 at timing of the clock signal on the system side (step S3).

Each time the decoder 7 receives data from an associated flip-flop circuit, the decoder 7 asserts for the generator 3 the FF data acknowledge signal indicating that the value has been determined (step S4).

When the generator 3 receives the FF data acknowledge signal that is produced from the decoder 7 and for which the meta-stable countermeasures are taken by the circuit 6, the generator 3 sends an empty FF indication signal to the generator 2 (step S5) to change a flip-flop circuit from the state not to receive new data again to the state to receive new data (step S6).

After the data latch operation is conducted as above, to enter the data input enable state, it is necessary for the flip-flop circuit in the array 4 to wait for the FF data acknowledge signal from the decoder 7. It is therefore required to prepare a plurality of flip-flop circuits to carry out operation like a First-In-First-Out operation. The number of flip-flop circuits is determined on the basis of the operation frequency on the D/S encoding I/F side and that on the system side.

Since the data items may be successively received depending on cases, it is required for the decoder 7 to immediately receive data items from the D/S encoding I/F side.

The decoder 7 receives multi-bit data from the array 4 such that when the quantity of data bits reaches a value to conduct the decoding operation, the decoder 7 starts decoding the command, determines command data for the succeeding-stage circuit 11, and asserts the command enable signal (step S7). Thereafter, when the command acknowledgement signal is asserted by the succeeding-stage circuit 11, the decoder stops assertion of the command enable signal (step S8).

Second Embodiment

First, description will be given of an outline of a second embodiment.

Data is latched by use of a clock signal created using the data and a strobe signal. At timing of a subsequent clock signal, a command is latched to be fed to a succeeding-stage circuit. Ordinarily, even after the command data is entirely received, a null packet exists on the transmission path, and hence it is possible to create a clock signal. However, if the transmission path is disconnected after the last data is received, the command cannot be decoded and the system enters a locked state. As fail-safe countermeasures against the difficulty, a pseudo clock signal is fed to a preceding-stage circuit if the state of a state machine (a link interface state machine conforming to SpaceWire standard) to control data transfer in the succeeding-stage circuit is changed to an error reset state indicating the initial state and the reset state. As a result, a result of the final decoding operation can be passed to the succeeding-stage circuit. The second embodiment includes a larger number of data transfer FF circuits than the first embodiment.

Figure 3:
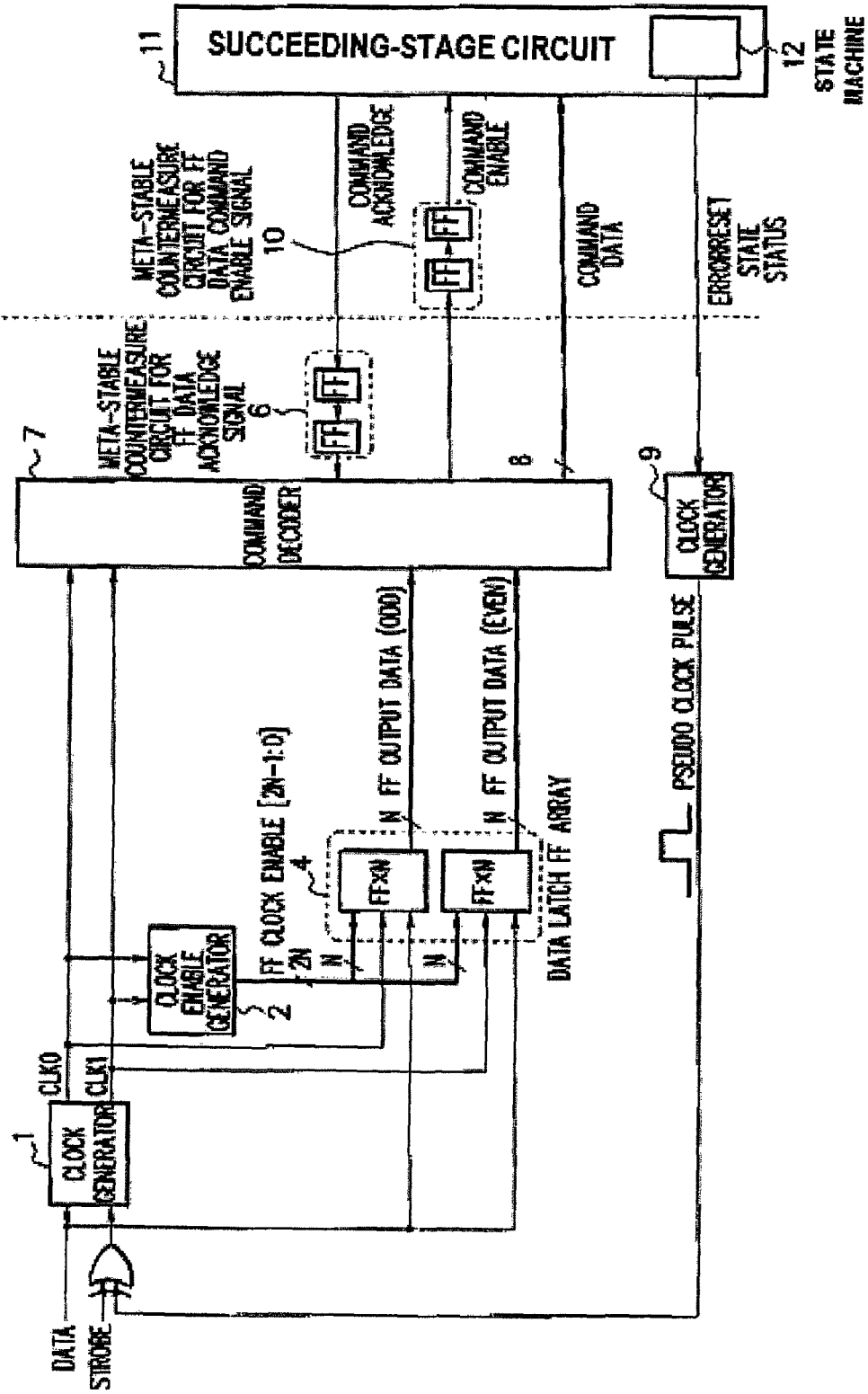
FIG. 3 a block diagram schematically showing an entire configuration of a second embodiment.

Referring now to FIG. 3, description will be given of a configuration of the second embodiment.

As can be seen from FIG. 3, the second embodiment includes a clock generator 1, a clock enable generator 2, a data latch flip-flop array 4, a meta-stable countermeasure circuit for flip-flop data acknowledge signal 6, a command decoder 7, a clock generator 9, and a meta-stable countermeasure circuit for flip-flop data command enable flag 10.

In FIG. 3, the generator 1, the generator 2, the array 4, the decoder 7, the generator 9, and the circuit 6 operate according to a clock signal created using the data and the strobe. In the second embodiment, the circuits are collectively called "D/S encoding InterFace (I/F) side".

Also in FIG. 3, the circuit 10 operates on a clock signal for the succeeding-stage circuit 11. In this embodiment, the circuit is called "system side".

The generator 1 is a clock generating circuit to create a clock signal for the D/S encoding (DS-link) scheme in which serial data and a strobe signal are delivered through mutually different lines. At change in the data or the strobe signal, the generator 1 alters its clock signal (CLK0, CLK1). The signal CLK0 is a reverse signal of the signal CLK1.

The generator 2 asserts, for either one of the flip-flop (FF) circuits of the array 4, an enable signal, i.e., a flip-flip clock enable signal to enable latching of one-bit data. The target flip-flop circuit to be enabled is sequentially determined according to CLK0 and CLK1.

The array 4 latches data including successive bits in flip-flop circuits selected by the enable signal (flip-flop enable signal) produced from the generator 2 and feeds the flip-flop output data to the decoder 7.

The decoder 7 decodes a command using the flip-flop output data including a plurality of bits received from the array 4, determines "command data" for the succeeding-stage circuit 11, and then asserts a command enable signal. When an assertion signal for a command acknowledge signal is received from the succeeding-stage circuit 11, the decoder 7 stops the assertion of the command enable signal to update the command data and then again asserts the command enable signal.

The generator 9 monitors a status signal that is asserted if the state of a state machine 12 (a link interface state machine conforming to SpaceWire standard) to control data transfer in the succeeding-stage circuit is in an ErrorReset state, i.e., an initial state and a reset state. If the state of the state machine 12 changed to "assertion", the generator 9 produces one pulse and performs the "exclusive or" (XOR) operation for the pulse and the strobe signal to thereby create a pseudo clock pulse.

The circuit 6 is arranged, since the "command acknowledge signal" is asynchronously transferred between the system side and the decoder 7, to suppress influence at occurrence of a meta-stable state. The circuit 6 includes flip-flop circuits and is generally formed in a two-stage cascade configuration in which the number of stages may be changed depending on associated factors such as the operation frequency.

The circuit 10 is employed, since the "command enable signal" is asynchronously transferred between the decoder 7 and the system side, to suppress influence at occurrence of a meta-stable state. The circuit 6 includes flip-flop circuits and is generally constructed in a two-stage cascade configuration. The number of stages may be changed depending on, for example, the operation frequency.

Figure 4:
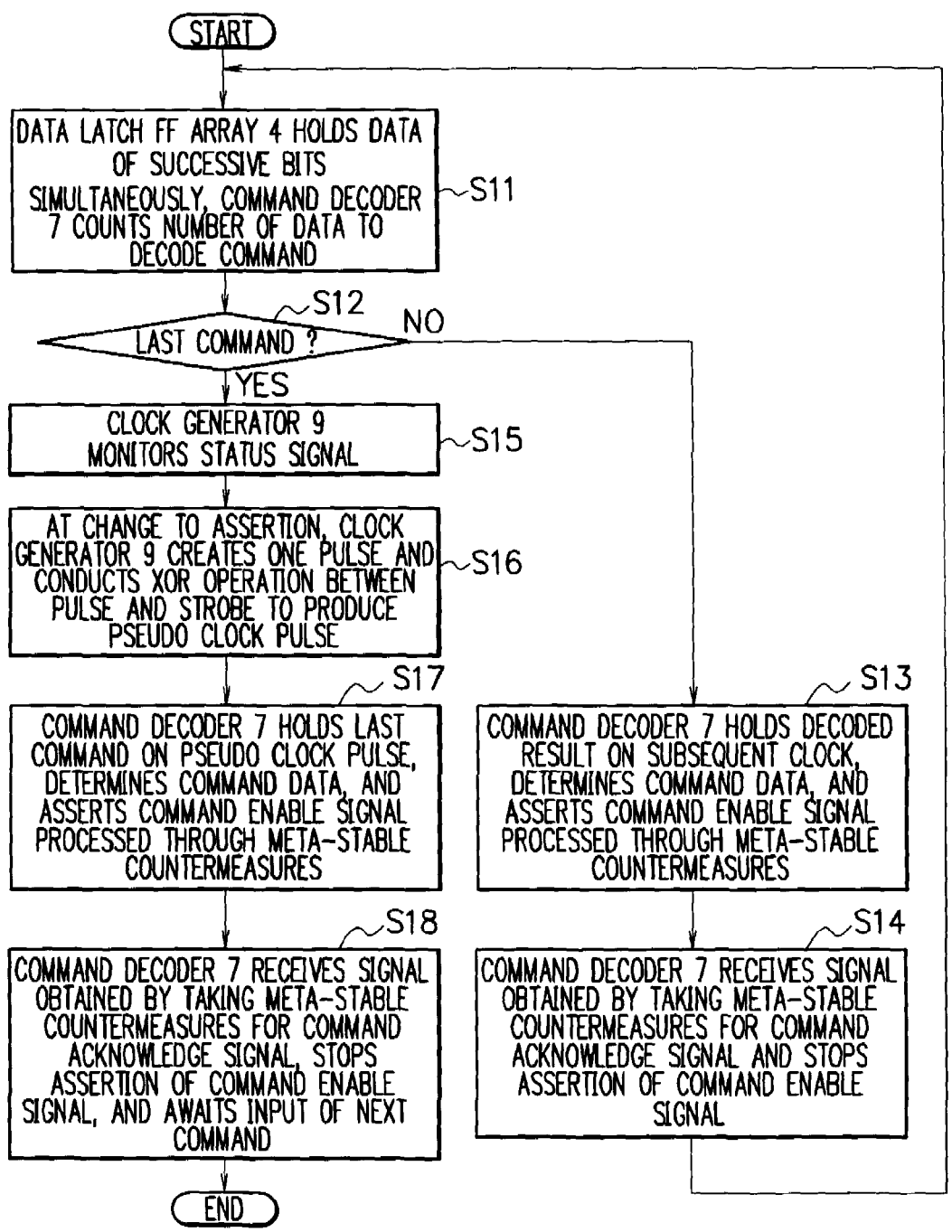
FIG. 4 is a flowchart showing operation of the second embodiment.

Referring next to FIGS. 3 and 4, description will be given of an operation of the second embodiment.

In response to an FF clock enable signal from the generator 2, the array 4 latches command data including a plurality of successive bits. The decoder 7 then receives data, i.e., FF output data from the array 4. At the same time, the decoder 7 counts command data bits according to clock signals created from the generator 9. When the number of bits reaches a value for the decoding operation, the decoder 7 conducts a command decoding operation, namely, decodes the FF output data (step S11).

As a result, if it is determined that the command is other than the last command (no in step S12), the decoder 7 latches the decoded result by a flip-flop circuit in the decoder 7 according to a subsequent clock signal (a change in the data or the strobe signal), determines the command data for the succeeding-stage circuit 11, and asserts the command enable signal for which the circuit 10 takes the meta-stable countermeasures (step S13).

When the command acknowledgement signal from the succeeding-stage circuit 11 for which the circuit 6 adopts the meta-stable countermeasures is received, the decoder 7 stops the assertion of the command enable signal and then returns to step S11 (step S14). In this way, for the commands other than the last command among the commands thus received, the handshaking takes place for each command data by use of the command enable signal and the command acknowledge signal.

On the other hand, if the command is the last command (yes in step S12), it is likely that no clock signal is produced thereafter. Therefore, the generator 9 monitors the status signal that is asserted if the state of a state machine 12 (a link interface state machine conforming to SpaceWire standard) to control data transfer in the succeeding-stage circuit 11 is in an ErrorReset state indicating an initial state and a reset state (step S15). If the state of the state machine 12 changed to "assertion", it is assumed that the link is disconnected and then the generator 9 creates one pulse to perform the "exclusive or" (XOR) operation for the pulse and the strobe signal to generate a pseudo clock pulse (step S16).

According to the pseudo clock signal, the last command thus decoded is latched by a flip-flop circuit in the decoder 7 as in the ordinary operation. The decoder 7 determines the command data for the succeeding-stage circuit 11 and then asserts the command enable signal for which the circuit 10 takes the meta-stable countermeasures (step S17).

Thereafter, at reception of the command acknowledge signal from the succeeding-stage circuit 11 for which the circuit 6 adopts the meta-stable countermeasures, the decoder 7 stops the assertion of the command enable signal and waits for an input of a subsequent command (step S18).

According to the embodiments of the present invention described above, since the delay control conventionally conducted by using a delay element or the like can be dispensed with, it is not necessary to design the system in consideration of delays depending on device characteristics each time the digital LSI circuit to be mounted in the system is altered. Therefore, the LSI circuit in which the D/S encoding (DS-link encoding) scheme is mounted can be easily designed according to the logical designing technique for digital LSI circuits. This advantageously reduces the period of time required for the system designing. Also, since the LSI circuit dedicated for the delay control is not required, there is obtained an advantage that the system cost is lowered.

Although description has been given of the embodiments in accordance with the present invention, the present invention is not restricted by the embodiments. The embodiments may be changed and modified in various ways within the scope and the spirit of the present invention.

In the serial data transmission system such as the D/S encoding scheme (DS-ling encoding scheme) using a change in the data and a change in the strobe signal as clock signals for the latching operation, the present invention is applicable in a situation in which even the serial data transfer does not occur after the last data is received, it is required for the receiver side to receive the last data as a command.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A data/strobe encoding scheme circuit in which data and a strobe signal are transmitted through mutually different lines, a change in the data and a change in the strobe signal are employed as clock signals for a latching operation, and the data is transmitted to a circuit operating on a second clock signal in a succeeding stage, comprising:
    a clock generator circuit for generating and outputting a clock signal according to predetermined data and a predetermined strobe signal and changing the clock signal when the data or the strobe signal varies;
    a clock enable generator circuit for generating and outputting an enable signal to enable latching of the data;
    a flip-flop enable flag generator circuit for creating and outputting, synchronized with the clock enable generator circuit, if the clock signal produced from the clock generator circuit is changed, a flip-flop enable flag indicating a flip-flop circuit having latched data to be received;
    a data latch flip-flop array including a plurality of flip-flop circuits for latching the data by a flip-flop circuit selected by an enable signal produced from the clock enable generator circuit and producing the data as flip-flop output data;
    a meta-stable countermeasure circuit for flip-flop data enable flag for taking meta-stable countermeasures for the flip-flop data enable flag produced from the flip-flop enable flag generator circuit;
    a command decoder circuit for receiving the flip-flop output data produced from the data latch flip-flop array and the flip-flop data enable flag processed through meta-stable countermeasures by the meta-stable countermeasure circuit for flip-flop data enable flag; and
    a meta-stable countermeasure circuit for flip-flop data acknowledge signal for taking meta-stable countermeasures for the flip-flop data acknowledge signal produced from the command decoder circuit, wherein:
    the command decoder circuit refers to the flip-flop data enable flag and latches, for bits thus asserted, the flip-flop output data received from the data latch flip-flop array, according to the clock signal of the succeeding-stage circuit, and
    asserts, each time data is received from the flip-flop circuit, the flip-flop data acknowledge signal for the flip-flop enable flag generator circuit;
    the flip-flop enable flag generator circuit receives the flip-flop data acknowledge signal which is produced from the command decoder circuit and for which the meta-stable countermeasure circuit for flip-flop data acknowledge signal has taken meta-stable countermeasures and then sends to the clock enable generator circuit an empty flip-flop indication signal indicating a flip-flop circuit not having held unread data; and
    the clock enable generator circuit receives the empty flip-flop indication signal from the flip-flop enable flag generator circuit, sequentially generates enable signals, and sets the flip-flop circuit of the data latch flip-flop array in a state not receiving new data, again to an input enable state.

2. The data/strobe encoding scheme circuit in accordance with claim 1, wherein:
    the command decoder circuit decodes a command using data including a plurality of bits received from the data latch flip-flop array when an amount of data bits of the data reaches a value to conduct a command decoding operation, determines command data for the succeeding-stage circuit, and asserts a command enable signal; and
    stops assertion of the command enable signal if assertion of a command acknowledge signal is received from the succeeding-stage circuit.

3. The data/strobe encoding scheme circuit in accordance with claim 1, wherein each of the meta-stable countermeasure circuit for flip-flop data enable flag and the meta-stable countermeasure circuit for flip-flop data acknowledge signal include includes flip-flop circuits in stages the number of which corresponds to an operation frequency thereof or the like.

4. The data/strobe encoding scheme circuit in accordance with claim 1, wherein the number of flip-flop circuits of the data latch flip-flop array is determined by an operation frequency of the clock signal produced from the clock generator circuit.

5. A data/strobe encoding scheme circuit in which data and a strobe signal are transmitted through mutually different lines, a change in the data and a change in the strobe signal are employed as clock signals for a latching operation, and the data is transmitted to a succeeding-stage circuit operating on a second clock signal in a succeeding stage, the circuit comprising:
- a clock generator circuit for generating and outputting a clock signal according to predetermined data and a predetermined strobe signal and changing the clock signal when the data or the strobe signal varies;
- a clock enable generator circuit for generating and outputting an enable signal to enable latching of the data;
- a data latch flip-flop array including a plurality of flip-flop circuits for latching the data including a plurality of successive bits constituting a command, by a flip-flop circuit selected by an enable signal produced from the clock enable generator circuit and producing the data as flip-flop output data;
- a command decoder circuit for receiving the flip-flop output data produced from the data latch flip-flop array;
- a meta-stable countermeasure circuit for flip-flop data command enable signal for taking meta-stable countermeasures for a command enable signal produced from the command decoder circuit;
- a meta-stable countermeasure circuit for flip-flop data acknowledge signal for taking meta-stable countermeasures for a flip-flop data acknowledge signal produced from the succeeding-stage circuit; and
- a clock generator circuit for monitoring a status signal which is asserted if a state of a state machine controlling data transfer of data in the succeeding-stage circuit is an error reset state which is a state indicating an initial state and an error reset state, generating one pulse if the status signal is changed to an asserted state, and conducting an eXclusive OR (XOR) operation between the pulse and the strobe signal to thereby create a pseudo clock signal, wherein the command decoder circuit
- receives the flip-flop output data produced from the data latch flip-flop array, counts the bits of the data including a plurality of bits according to the clock signal produced from the clock generator circuit, and decodes a command for the flip-flop output data when an amount of bits of the data reaches a value to conduct a decoding operation;
- latches, if the command is other than a last command as a result of the decoding operation, a decoded result of the decoding operation according to a subsequent clock signal, determines command data for the succeeding-stage circuit, and asserts the command enable signal for which the meta-stable countermeasure circuit for flip-flop data command enable signal has taken meta-stable countermeasures;
- receives a command acknowledge signal which is produced from the succeeding-stage circuit and for which the meta-stable countermeasure circuit for flip-flop data acknowledge signal has taken meta-stable countermeasures, stops assertion of the command enable signal, and decodes again a command using the flip-flop output data;
- monitors by the clock generator circuit, if the command is the last command as a result of the decoding operation, the status signal which is asserted if the state of a state machine controlling data transfer of data in the succeeding-stage circuit is an error reset state which is a state indicating an initial state and an error reset state, assumes that a link has been disconnected, if the status signal is changed to an asserted state, generates one pulse, and conducts an XOR operation between the pulse and the strobe signal to thereby create a pseudo clock signal;
- latches, according to the pseudo clock signal, the last command thus decoded, determines command data for the succeeding-stage circuit, and asserts the command enable signal for which the meta-stable countermeasure circuit for flip-flop data command enable signal has taken meta-stable countermeasures; and
- receives the command acknowledge signal which is produced from the succeeding-stage circuit and for which the meta-stable countermeasure circuit for flip-flop data acknowledge signal has taken meta-stable countermeasures, stops assertion of the command enable signal, and waits for an input of a subsequent command.

6. The data/strobe encoding scheme circuit in accordance with claim 5, wherein each of the meta-stable countermeasure circuit for flip-flop data command enable signal and the meta-stable countermeasure circuit for flip-flop data acknowledge signal include includes flip-flop circuits in stages the number of which corresponds to an operation frequency thereof or the like.

7. A data/strobe encoding method in which data and a strobe signal are transmitted through mutually different lines, a change in the data and a change in the strobe signal are employed as clock signals for a latching operation, and the data is transmitted to a circuit operating on a second clock signal in a succeeding stage, comprising:
- a clock generating step of generating and outputting a clock signal according to predetermined data and a predetermined strobe signal and changing the clock signal when the data or the strobe signal varies;
- a clock enable generating step of generating and outputting an enable signal to enable latching of the data;
- a flip-flop enable flag generating step of creating and outputting, synchronized with the clock enable generator circuit, if the clock signal produced from the clock generator circuit is changed, a flip-flop enable flag indicating a flip-flop circuit having latched data to be received;
- a flip-flop data output step of latching the data by a flip-flop circuit selected by an enable signal produced from the clock enable generating step;
- a meta-stable countermeasure step for flip-flop data enable flag of taking meta-stable countermeasures for the flip-flop data enable flag produced from the flip-flop enable flag generating step;
- a flip-flop output data latching step of referring to the flip-flop data enable flag for which the meta-stable countermeasure step for flip-flop data enable flag has taken meta-stable countermeasures and latching, for bits thus asserted, the flip-flop output data outputted from the flip-flop data output step, according to the clock signal of the succeeding-stage circuit;
- a flip-flop data acknowledge signal output step of outputting a flip-flop data acknowledge signal each time data is received from each flip-flop circuit;
- a meta-stable countermeasure step for flip-flop data acknowledge signal of taking meta-stable countermeasures for the flip-flop data acknowledge signal produced from the flip-flop data acknowledge signal output step;
- an empty flip-flop indication output step of receiving the flip-flop data acknowledge signal for which the meta-stable countermeasure step for flip-flop data acknowledge signal has taken meta-stable countermeasures and then producing an empty flip-flop indication signal indicating a flip-flop circuit not having held unread data; and a data input enable step of receiving the empty flip-flop indication signal from the empty flip-flop indication output step and setting the flip-flop circuit in a state not receiving new data, again to an input enable state.

8. The data/strobe encoding method in accordance with claim 7, comprising:

a command enable signal asserting step of decoding a command using data including a plurality of bits received in the flip-flop data output step when an amount of data bits of the data reaches a value to conduct a command decoding operation, determining command data for the succeeding-stage circuit, and asserting a command enable signal; and a command enable signal assertion stop step of stopping assertion of the command enable signal if assertion of a command acknowledge signal is received from the succeeding-stage circuit.

9. A data/strobe encoding method in which data and a strobe signal are transmitted through mutually different lines, a change in the data and a change in the strobe signal are employed as clock signals for a latching operation, the method comprising:

a clock generating step of generating and outputting a clock signal according to predetermined data and a predetermined strobe signal and changing the clock signal when the data or the strobe signal varies;

a clock enable generating step of generating and outputting an enable signal to enable latching of the data;

a flip-flop data output step of latching the data including a plurality of successive bits constituting a command, by a flip-flop circuit selected by an enable signal produced in the clock enable generating step and producing the data as flip-flop output data;

a command decoding step of receiving the flip-flop output data produced in the data latch flip-flop output step, counting the bits of the data including a plurality of bits according to the clock signal produced in the clock generating step, and decoding a command for the flip-flop output data when an amount of bits of the data reaches a value to conduct a decoding operation;

a step of latching, if the command is other than a last command as a result of the decoding operation, a decoded result of the decoding operation according to a subsequent clock signal, determining command data for the succeeding-stage circuit, asserting the command enable signal for which a meta-stable countermeasure circuit for flip-flop data command enable signal has taken meta-stable countermeasures;

a step of receiving a command acknowledge signal which is produced from the succeeding-stage circuit and for which a meta-stable countermeasure circuit for flip-flop data acknowledge signal has taken meta-stable countermeasures, stopping assertion of the command enable signal, and decoding again a command using the flip-flop output data;

a step of monitoring, if the command is the last command as a result of the decoding operation, a status signal which is asserted if a state of a state machine controlling data transfer of data in the succeeding-stage circuit is an error reset state which is a state indicating an initial state and an error reset state, assuming that a link has been disconnected, if the status signal is changed to an asserted state, generating one pulse, and conducting an XOR operation between the pulse and the strobe signal to thereby create a pseudo clock signal;

a step of latching, according to the pseudo clock signal, the last command thus decoded, determining command data for the succeeding-stage circuit, and asserting the command enable signal for which the meta-stable countermeasure circuit for flip-flop data command enable signal has taken meta-stable countermeasures; and a step of receiving the command acknowledge signal which is produced from the succeeding-stage circuit and for which the meta-stable countermeasure circuit for flip-flop data acknowledge signal has taken meta-stable countermeasures, stopping assertion of the command enable signal, and waiting for an input of a subsequent command.

\* \* \* \* \*